United States Patent
Akagi et al.

[11] Patent Number: 5,914,532
[45] Date of Patent: Jun. 22, 1999

[54] LEAD FRAME, METHOD FOR MANUFACTURING THE SAME, AND SEMICONDUCTOR DEVICE EMPLOYING THE SAME

[75] Inventors: Kazuhito Akagi; Yasushi Umeda, both of Kanagawa; Mitsuyuki Kakimoto, Tokyo, all of Japan

[73] Assignees: Sony Corporation; Noge Electronic Industries Co., Ltd.; Sumitomo Metal Mining Co., Ltd., all of, Japan

[21] Appl. No.: 09/052,021

[22] Filed: Mar. 31, 1998

[51] Int. Cl.$^6$ .......................... H01L 23/48; H01L 23/495
[52] U.S. Cl. .......................... 257/677; 257/666; 361/813; 438/123
[58] Field of Search .................... 257/666, 677, 257/691; 438/123; 361/813

[56] References Cited

U.S. PATENT DOCUMENTS

| | | | |
|---|---|---|---|
| 5,001,546 | 3/1991 | Butt | 257/666 |
| 5,206,186 | 4/1993 | Neugebana et al. | 257/666 |
| 5,436,082 | 7/1995 | Mathew | 257/666 |
| 5,635,755 | 6/1997 | Kinghorn | 257/666 |
| 5,668,060 | 9/1997 | Sato et al. | 257/666 |
| 5,675,177 | 10/1997 | Abys et al. | 257/666 |
| 5,684,329 | 11/1997 | Serizawa | 257/666 |

*Primary Examiner*—Mahshid Saadat
*Assistant Examiner*—Jhihan B Clark
*Attorney, Agent, or Firm*—Rader, Fishman & Grauer; Ronald P. Kananen

[57] ABSTRACT

An object of this invention is to effectively prevent a progress of corrosion due to a local cell produced between a copper raw material (30) of a lead frame and a plating layer (29) on the surface, secure an anchor effect necessary for a chip loading surface without providing a palladium or palladium alloy film (29) with an excessive thickness and improve the reliability of a semiconductor device while achieving a reduction of production cost of a semiconductor device.

Ground plating layers (27), (28) of multilayer structure of nickel are formed entirely on the surface of the raw material and then the palladium or palladium alloy plating layer (29) is formed on the surface thereof. A first ground plating layer (27) is formed so as to have an elaborate quality by supplying a DC current of a predetermined current value thereto as a plating current. A second ground plating layer (28) is formed so as to have a precedence in growth of crystal in the vertical direction by supplying a current such as a pulse current, in which its current value changes as a plating current.

17 Claims, 2 Drawing Sheets

LEAD FRAME, METHOD FOR MANUFACTURING THE SAME, AND SEMICONDUCTOR DEVICE EMPLOYING THE SAME

BACKGROUND OF THE INVENTION

The present invention relates to a lead frame made of copper or copper alloy on a raw material, a method for manufacturing the same and semiconductor device employing the same lead frame.

Generally, in a semiconductor lead frame made of mainly copper base metal such as copper, copper alloy or the like as its raw material, its chip loading region and inner lead portion are plated with silver. After chip bonding, wire bonding and resin sealing are finished, its outer lead portion is plated with solder. After that, an unnecessary portion of the lead frame is cut off and then individual semiconductor devices are separated.

Japanese Examined Patent Publication No. S63-49382 has disclosed a lead frame for a semiconductor device in which the surface of any one or both of a chip loading portion and wire bonding is coated with palladium or palladium alloy.

According to such prior art technique in which a chip loading portion and inner lead portion of a lead frame for use are plated with silver, then chip bonding, wire bonding and sealing with resin for the lead frame are carried out and then an outer lead portion is plated with solder before an unnecessary portion of the lead frame is cut out, formation of plating needs to be carried out at completely different two stages, that is, production stage of the lead frame and substantial finishing stage of production of a semiconductor device. Thus, the production cost thereof increases, thereby leading to a large reason for blocking a reduction of production cost of the semiconductor device.

On the other hand, according to the technique disclosed in the aforementioned Japanese Examined Patent Publication No. S63-49382, on production stage of the lead frame, that is, on a stage after the lead frame is formed, the chip loading portion, wire bonding portion and outer lead portion of the lead frame are plated with palladium or palladium alloy. In this case, because palladium or palladium alloy has an excellent solderability, it is not necessary to perform plating procedure to improve the solderability before the unnecessary portion of the lead frame is cut after sealing with resin. Therefore, the number of manufacturing works can be decreased.

However, in this technique disclosed in the aforementioned Japanese Examined Patent Publication No. S63-49382, unless the palladium is plated with in a quite large thickness, an influence of the nickel film thereunder is so strong that an anchor effect necessary for loading a chip cannot be obtained.

That is, when plating the chip loading region and the like with palladium or palladium alloy, a surface of raw material made of copper or the like cannot be directly plated therewith. After a ground layer is formed with nickel, the surface thereof must be plated with palladium or palladium alloy. In this case, usually the nickel plating is formed so as to have an elaborate, smooth film. The reason for this is that the elaborate smooth nickel layer needs to be formed so as to prevent an occurrence of defect such as pin hole or the like, which leads to formation of a local cell between a top surface and that layer. If the local cell is formed, corrosion is induced in the raw material.

However, if the plating film of palladium or palladium alloy is thin and if its ground layer is elaborate and smooth, the characteristics of palladium or palladium alloy, that is, hydrogen absorption characteristic, brittleness and the like thereof cannot be demonstrated sufficiently, so that the anchor effect necessary for the chip loading portion cannot be obtained. However, if the thickness of palladium or palladium alloy is increased, raw material cost increases because palladium is a very expensive metal. As a result, the price of the lead frame also increases, which is a serious problem.

Further, it is known that because the palladium has a catalytic action for gas, various gases, particularly organic gases, produced on assembly process of the semiconductor device are absorbed by palladium or palladium alloy film, so that the solderability of palladium or palladium alloy film deteriorates. To solve this problem, there is an art for forming a gold plating layer on the surface of the palladium or palladium alloy film. If the art of plating a top surface of a lead frame with gold is applied to the art of the Japanese Examined Patent Publication No.S63-49382, because the gold is a precious metal having a very high chemical stability, adhesive property between the sealing resin and this layer drops.

If the gold film is formed on the surface of the palladium or palladium alloy film as mentioned above, there occurs a worse influence than the bad influence resulting from a local cell between the lead frame raw material and the palladium or palladium alloy film, because the potential difference between the gold and the lead frame raw material is larger than the potential difference between the palladium or palladium alloy film and the lead frame raw material, and hence reliability is lowered.

SUMMARY OF THE INVENTION

In view of such aspects, it is therefore an object of the present invention to provide a method wherein a progress of corrosion due to local cell produced between a raw material mainly made of copper or copper base metal of a lead frame and a plating layer on the surface is effectively prevented, an anchor effect necessary for a chip loading surface can be secured without providing a palladium or palladium alloy film with an excessive thickness and the reliability of a semiconductor device is improved while reduction of production cost of a semiconductor device is achieved. Further, even if the surface is plated with gold, its adhesiveness to resin is not lowered.

A feature of the present invention exists in that a ground plating layer of multilayer structure is formed entirely on the surface of a raw material and further a palladium or palladium alloy plating layer is formed on the of the ground plating layer.

Therefore, according to the present invention, the ground plating layer existing between a lead raw frame material and a top layer has the multilayer structure, so that a contact potential difference occurs between the layers. This potential difference suppresses a local cell effect which is caused between the raw material and the top layer, and promotes corrosion, thereby suppressing the corrosion.

Here, the contact potential difference will be explained. Contact potential difference refers to a potential difference caused when different kinds of metals are brought into contact with each other. Even if the same material layers, for example, nickel layers are formed, and if its lower nickel layer and upper nickel layer are formed in different ways, the contact potential difference occurs. Then, if the contact potential difference occurs, it means that physically different metals are disposed adjacent to each other. Therefore, in a case when multilayer structure layers are formed with the same material in different ways, if a potential difference occurs between the layers, it means that those layers are made of different metals. Speaking more in detail, those layers contain the same elements but have different physical properties.

According to the present invention, an upper layer of the ground plating layer of multilayer structure made of nickel or nickel alloy is formed by a plating method having a precedence in growth of crystal in the vertical direction, for example, a method of plating by supplying a pulse current as a plating current, While a lower layer thereof is formed by a plating method capable of forming an elaborate, smooth surface for example, a method of plating by supplying a DC current of a constant current value as a plating current. In this case, the lower layer of the ground plating layers covers the surface of the raw material of the lead frame elaborately with its fine grains. Thus, an occurrence of pin hole can be prevented, so that it is possible to prevent an occurrence of corrosion due to the local cell which may be caused by such defect as the pin hole or the like.

Further, because the upper layer of the ground plating layer is formed by the plating method in which a speed of crystal growth in the vertical direction is fast, even if a palladium or palladium alloy film formed thereon is thin, the characteristic of that film is not killed, so that a sufficient anchor effect necessary for a chip loading region can be obtained. Thus, use amount of expensive palladium can be reduced and therefore the prices of the lead frame and a semiconductor device can be reduced. Further, when sealing with resin, in the upper layer made of crystal grown in the vertical direction of the ground plating layer, its crystal is easy to be destroyed by filler in the resin, so that the surfaces of the palladium or palladium alloy film and the ground plating layer are in contact with the resin by the destruction, thereby intensifying adhesive strength between the resin and the lead frame. The advantage can be enjoyed also when a gold film is formed on the surface of palladium or palladium alloy film by plating.

Then, when the gold film is formed on the palladium or palladium alloy film by plating, an excellent solderability can be obtained thereby. Therefore, it is possible to eliminate a process for plating before an unnecessary portion of the lead frame is cut out after sealed with resin, thereby reducing the number of production steps.

BRIEF DESCRIPTION OF THE DRAWINGS

FIGS. 1A and 1B are sectional views showing a first embodiment of the present invention, in which FIG. 1A is a sectional view of a semiconductor device and FIG. 1B is a sectional view showing a sectional structure of a lead frame;

DETAILED DESCRIPTION OF THE PREFERRED EMBODIMENTS

An embodiment of the present invention will be described in detail with reference to the accompanying drawings.

Figure 1A:
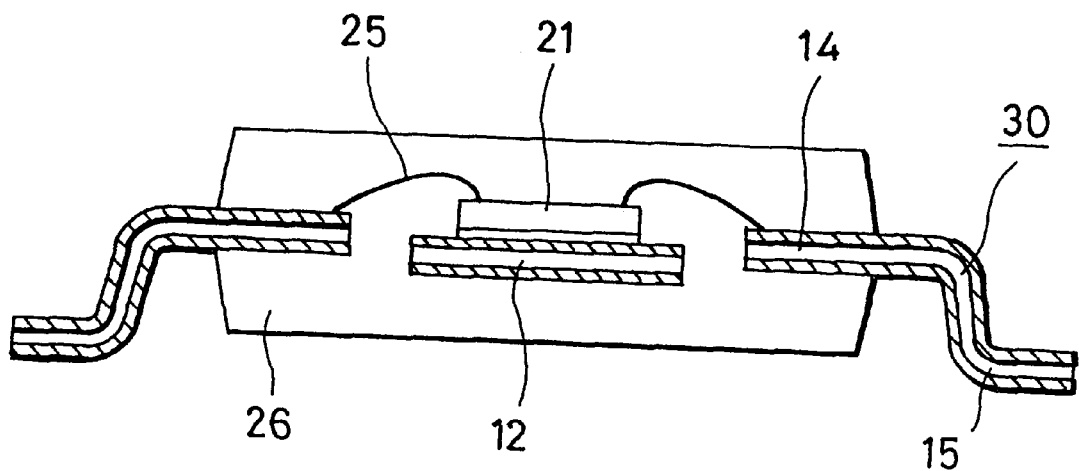
Figure 1B:
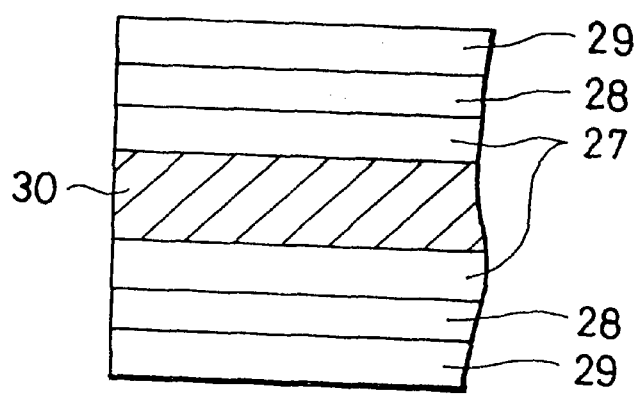
Figure 2:
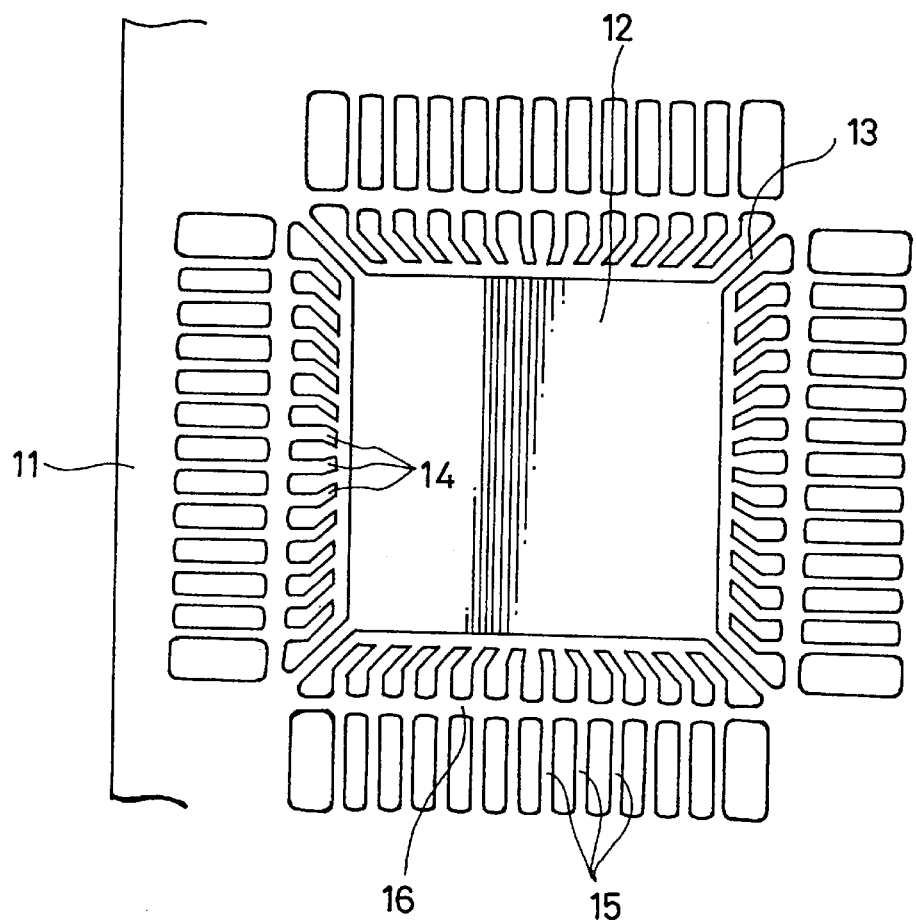
FIG. 2 is a plan view showing a lead frame according to the first embodiment.

FIGS. 1A and 1B are sectional views showing a first embodiment of the present invention. FIG. 1A is a sectional view of a semiconductor device and FIG. 1B is a sectional view showing a structure of a lead frame. FIG. 2 is a plan view of the lead frame. In FIGS. 1A, 1B and 2, reference numeral 11 denotes a guide rail portion, numeral 12 denotes a chip loading portion, numeral 13 denotes a supporting portion for supporting the chip loading portion 12, numeral 14 denotes an inner lead, numeral 15 an denotes outer lead, and numeral 16 denotes a tie-bar for tying the space among the respective outer leads. The lead frame shown in FIG. 2 is formed by etching or pressing a metallic plate 30 made of copper or copper alloy. Then, after etching or pressing, this metallic plate 30 is subjected to a plating treatment so that a sectional structure shown in FIG. 1B is obtained. This plating work will be described in detail later on.

After the plating treatment, a semiconductor chip 21 is bonded to the chip loading portion 12. Each of the electrodes of the semiconductor chip 21 is bonded to the corresponding inner lead 14 by a wire 25. After that, the semiconductor chip 21, the chip loading portion 12, the inner lead 14 and the wire 25 are sealed with resin 26. Then, an unnecessary portion of the lead frame is cut and then each of the semiconductor devices is made independent and also each of the outer leads 15 is also made independent. FIG. 1A shows that state.

A feature of the present embodiment exists in plating of the surface of the lead frame. This will be described in details with reference to FIG. 1B. Reference numeral 30 denotes a raw material made of copper or copper alloy. Numeral 27 denotes a first plating layer formed on the surface of the raw material 30, which is made of nickel and has a thickness of about 0.5 $\mu$m, for example. This plating is carried out by supplying a DC current (with a constant current value) of about 3A/cm$^2$ as plating current and as a result, a plating film having a smooth surface and an elaborate film quality. Therefore, such faults as pin hole and the like are unlikely to occur. This makes it difficult for a local cell between the raw material and a top surface layer of the plating to be produced, and finally suppresses a progress of corrosion due to the local cell.

Reference numeral 28 denotes a second plating layer which is made of nickel and has a thickness of about 0.5 $\mu$m, for example. This plating is carried out by supplying pulse current of about 3A/dm$^2$ as a plating current. This pulse current has a frequency of, for example, 200–2000 H$_Z$ (cycle: 5 mS–500 $\mu$s) and a duty ratio of, for example, a 80%. As a result, in this plating, growth of its crystal in vertical direction has a precedence over growth thereof in the lateral direction. The film quality of the second plating layer 28, different from the first plating layer 27, has an excellent adhesive property with a palladium or palladium alloy film formed after, a gold film formed further above and the bonding wire, and also with the sealing resin, so that an excellent bonding property and resin sealing property are secured.

Both the first plating layer 27 and the second plating layer 28 are made of nickel, however, their plating methods are different from each other. Thus, their film qualities are different so that a contact potential difference occurs therebetween. If such contact potential difference occurs, even if they are formed of the same material, it can be seen that they are of different qualities of materials in physical viewpoints. Because of that contact potential difference, corrosion due to a local cell effect between the raw material 30 and a top surface layer 29 can be suppressed. Meanwhile, the pulse current does not have to be a smart rectangular wave, but may be a triangular wave or a half-wave rectified wave or a full-wave rectified wave or DC a current in which a current value changes.

Reference numeral 29 denotes a plating film made of palladium or palladium alloy formed on the surface of the second plating layer 28, which is a very thin film having a thickness of about 0.05 μm, for example. The reason why the film is so thin is that the material cost can be reduced and further a necessary anchor effect can be obtained on the chip loading portion 12 despite that thin structure. The ground of the plating layer 28 is not the nickel layer 27 having the elaborate quality but the nickel layer 28 having a precedence in growth of crystal in the vertical direction. Thus, even if an influence on the ground is intensified by the thin structure, the anchor effect can be sufficiently obtained.

If the chip bonding and the wire bonding are carried out after such plating treatment, because the second plating layer 28 as the ground for the top surface layer 29 is of film quality having a precedence in growth of the crystal in the vertical direction, the contacting area between the bonding wire and the palladium or palladium alloy film increases, thereby making it possible to improve the reliability of the bonding.

Although the ground plating layers 28, 29 are made of nickel, they may be made of nickel alloy mixed with other metal and therefore it is not always necessary to use a completely pure nickel material.

Figure 3:
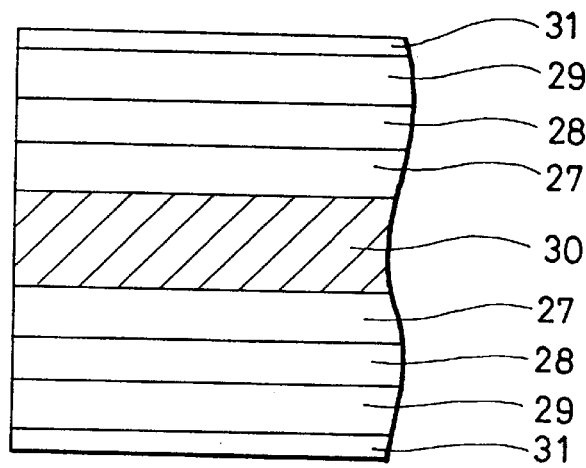
FIG. 3 is a sectional view showing a sectional structure of a lead frame according to a second embodiment of the present invention.

FIG. 3 is a sectional view showing a second embodiment of the present invention. The present embodiment is different from the first embodiment only in that on the palladium or palladium alloy film 29 there is formed a gold plating firm 31, however common in the other points. Then, because the common point has been already described, a description thereof is omitted and only a different point will be described below.

Referring to FIG. 3, reference numeral 31 denotes a gold plating film formed on the surface of the palladium or palladium alloy film 29, which has a thickness of, for example, 30–100 Å and is formed so as to improve its soldering property. That is, the palladium or palladium alloy film 29 has catalytic action for gas. Thus, this film absorbs various organic gases during the assembly process of the semiconductor device so that there is a fear that the soldering property may be deteriorated. By covering the film 29 with the gold film 31 having a high chemical stability, that phenomenon can be prevented.

Thus, according to the second embodiment, in addition to the effect enjoyed by the first embodiment, there is provided another effect that the deterioration of the soldering property can be prevented further effectively.

The second plating layer 28 exists under the palladium or palladium alloy film 29 which exists under the gold plating film 31. This second plating layer 28 is a film having a precedence in growth of its crystal in the vertical direction. Thus, when sealed by resin, the crystal is easy to be destroyed by filler in the resin, so that the palladium or palladium alloy film and the ground plating layer make contact with the resin because of the destruction. As a result, the adhesive strength between the resin and the lead frame can be intensified. According, it is possible to solve a conventional problem that when the gold plating film 31 is formed, the adhesive property between the sealing resin and the lead frame drops.

According to the present invention, the ground plating layer existing between the lead frame raw material and the top layer has multilayer structure, so that the contact potential difference occurs between the layers. This potential difference suppresses the local cell effect which is caused between the raw material and the top layer and promoter corrosion, thereby suppressing the corrosion.

According to the present invention, the upper layer of the ground plating layer of multilayer structure made of nickel or nickel alloy is formed by a plating method having precedence in growth if crystal in the vertical direction, for example, a method of plating by supplying a pulse current as a plating current, while the lower layer thereof is formed by a plating method capable of forming an elaborate, smooth surface, for example, a method of plating by supplying the DC current of a constant current value as a plating current. In this case, the lower layer of the ground plating layer covers the surface of the raw material of the lead frame elaborately with its fine grains. Accordingly, an occurrence of pin hole can be prevented, so that it is possible to prevent an occurrence of the corrosion due to the local cell which may be caused by such defect as the pin hole or the like.

Further, because the upper layer of the ground plating layer is formed by the plating method in which a speed of crystal growth in the vertical direction is fast, even if the palladium or palladium alloy film formed thereon is thin, the characteristic of that film is not killed, so that a sufficient anchor effect necessary for the chip loading region can be obtained. Therefor, the use amount expensive palladium can be reduced and hence the prices of the lead frame and the semiconductor device can be reduced. Further, when sealing with resin, in the upper layer made of crystal grown in the vertical direction of the ground plating layers, its crystal is easy to be destroyed by filler in the resin, so that the surfaces of the palladium or palladium alloy film and the ground plating layer are in contact with the resin by the destruction, thereby intensifying the adhesive strength between the resin and the lead frame. The advantage can be enjoyed also when the gold film is formed on the surface of the palladium or palladium alloy film by plating.

Then, when the gold film is formed on the palladium or palladium alloy film by plating, an excellent solderrability can be obtained. Therefore, it is possible to eliminate a process for plating before an unnecessary portion of the lead frame is cut out after sealed with resin, thereby reducing the number of production steps.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A lead frame using a first metal as a raw material, comprising:
a ground plating layer of multilayer structure formed entirely on a surface of said raw material, said ground plating layer of multilayer structure comprising:
a first layer, which consists of a second metal, and
a second layer, which consists of said second metal, and has a physical quality different from said first layer, whereby a contact potential difference occurs between said first and second layers; and
a plating layer made of a third metal and formed on a surface of said ground plating layer.

2. A lead frame according to claim 1, wherein said first metal is a metal whose main component is copper or copper base metal.

3. A lead frame according to claim 1, wherein said second metal is nickel or nickel alloy.

4. A lead frame according to claim 1, wherein said third metal is palladium or palladium alloy.

5. A lead frame according to claim 1, wherein a gold plating film is formed on the surface of said plating layer of said third metal.

6. A lead frame according to claim 1, wherein said physical quality comprises a difference in vertical growth of a crystal of said second layer from said first layer.

7. A lead frame according to claim 1, wherein said physical quality comprises a difference in lateral growth of a crystal of said second layer from said first layer.

8. A lead frame according to claim 1, further comprising:

a plating layer made of a fourth metal, formed on a surface of said plating layer made of a third metal.

9. A lead frame according to claim 8, wherein said fourth metal is gold.

10. A semiconductor device, comprising:

a semiconductor chip, and a lead frame which uses a first metal as a raw material, and in which a ground plating layer of multilayer structure is formed entirely on a surface of said raw material, said ground plating layer being made of a second metal having dual layers of different physical qualities, and thereby having a contact potential difference, and a plating layer of a third metal is formed on a surface of said ground plating layer, wherein said semiconductor chip is connected to said lead frame.

11. A semiconductor device according to claim 10, wherein said first metal is a metal whose main component is copper or copper.

12. A semiconductor device according to claim 10, wherein said second metal is nickel or nickel alloy.

13. A semiconductor device according to claim 10, wherein said third metal is palladium or palladium alloy.

14. A semiconductor device according to claim 10, wherein the different physical qualities of said dual layers of said second metal comprise a difference in vertical growth of a crystal of each of said dual layers.

15. A semiconductor device according to claim 10, wherein the different physical qualities of said dual layers of said second metal comprise a difference in lateral growth of a crystal of each of said dual layers.

16. A semiconductor device according to claim 10, further comprising:

a plating layer of a fourth metal, formed on a surface of said plating layer of a third metal.

17. A semiconductor device according to claim 16, wherein said fourth metal is gold.

* * * * *